United States Patent
Nishihara et al.

(10) Patent No.: US 9,712,135 B2
(45) Date of Patent: Jul. 18, 2017

(54) ACOUSTIC WAVE FILTER AND DUPLEXER

(71) Applicant: TAIYO YUDEN CO., LTD., Tokyo (JP)

(72) Inventors: Tokihiro Nishihara, Tokyo (JP); Shinji Taniguchi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 148 days.

(21) Appl. No.: 14/528,597

(22) Filed: Oct. 30, 2014

(65) Prior Publication Data
US 2015/0137908 A1    May 21, 2015

(30) Foreign Application Priority Data

Nov. 18, 2013  (JP) ................................ 2013-238180

(51) Int. Cl.
| | |
|---|---|
| H03H 9/02 | (2006.01) |
| H03H 9/70 | (2006.01) |
| H03H 9/60 | (2006.01) |
| H01P 5/16 | (2006.01) |
| H01P 7/08 | (2006.01) |
| H03H 3/04 | (2006.01) |
| H03H 9/58 | (2006.01) |
| H01P 1/203 | (2006.01) |
| H01P 5/02 | (2006.01) |
| H03H 3/02 | (2006.01) |

(52) U.S. Cl.
CPC ....... H03H 9/02102 (2013.01); H01P 1/2039 (2013.01); H01P 5/16 (2013.01);
(Continued)

(58) Field of Classification Search
CPC ........... H03H 9/02103; H03H 9/02834; H03H 9/542; H03H 9/605; H03H 9/6483;
(Continued)

(56) References Cited

U.S. PATENT DOCUMENTS 4,456,850 A    6/1984  Inoue et al.
5,726,610 A *  3/1998  Allen ................... H03H 9/6483
                                                  310/313 B
(Continued)

FOREIGN PATENT DOCUMENTS

| JP | S58-137317 A | 8/1983 |
| JP | 2002-268644 A | 9/2002 |
| JP | 2004-193929 A | 7/2004 |

OTHER PUBLICATIONS

Chinese Office Action dated Mar. 17, 2017 in a counterpart Chinese patent application No. 201410655028.9. (Partial translation of the Office Action is attached as a concise explanation of relevance.).
(Continued)

*Primary Examiner* — Robert Pascal
*Assistant Examiner* — Jorge Salazar, Jr.
(74) *Attorney, Agent, or Firm* — Chen Yoshimura LLP

(57) ABSTRACT

An acoustic wave filter includes series resonators and parallel resonators that have a piezoelectric film on an identical substrate and have a lower electrode and an upper electrode, wherein: one of the series resonators and the parallel resonators have a temperature compensation film on a face of the lower electrode or the upper electrode that is opposite to the piezoelectric film in a resonance region, the compensation film having an elastic constant of a temperature coefficient of which sign is opposite to a sign of a temperature coefficient of an elastic constant of the piezoelectric film; and the other have an added film on the same side as the temperature compensation film on the lower electrode side or the upper electrode side compared to the piezoelectric film in the resonance region in the one of the series resonators and the parallel resonators.

12 Claims, 10 Drawing Sheets

(52) U.S. Cl.
CPC ............... *H01P 7/08* (2013.01); *H03H 3/04* (2013.01); *H03H 9/587* (2013.01); *H03H 9/605* (2013.01); *H03H 9/706* (2013.01); *H01P 1/20381* (2013.01); *H01P 5/028* (2013.01); *H03H 2003/021* (2013.01); *H03H 2003/0407* (2013.01)

(58) Field of Classification Search
CPC ...... H03H 9/706; H03H 9/02102; H03H 3/04; H03H 2003/021; H03H 2003/0407; H03H 9/587; H01P 5/16; H01P 1/20381; H01P 1/2039; H01P 7/08; H01P 5/028
USPC .......................................... 333/133, 187, 188
See application file for complete search history.

(56) References Cited

U.S. PATENT DOCUMENTS

| | | | |
|---|---|---|---|
| 6,407,649 B1* | 6/2002 | Tikka | H03H 9/0571 29/25.35 |
| 7,106,148 B2* | 9/2006 | Kawamura | H03H 9/564 333/133 |
| 7,126,253 B2* | 10/2006 | Unterberger | H03H 9/605 310/320 |
| 7,348,714 B2* | 3/2008 | Inoue | H03H 9/02102 310/334 |
| 2002/0089393 A1 | 7/2002 | Tikka et al. | |
| 2004/0113720 A1 | 6/2004 | Komuro et al. | |
| 2007/0120625 A1* | 5/2007 | Larson, III | H03H 3/04 333/189 |
| 2012/0104900 A1* | 5/2012 | Nishihara | H03H 9/584 310/326 |
| 2013/0027153 A1* | 1/2013 | Shin | H03H 9/02102 333/133 |
| 2013/0038408 A1* | 2/2013 | Burak | H03H 9/132 333/187 |

OTHER PUBLICATIONS

Chinese Office Action dated Mar. 21, 2017 in a counterpart Chinese patent application No. 201410655028.9. (Partial translation of the Office Action is attached as a concise explanation of relevance.).

* cited by examiner

FIG. 1A
FIG. 1B
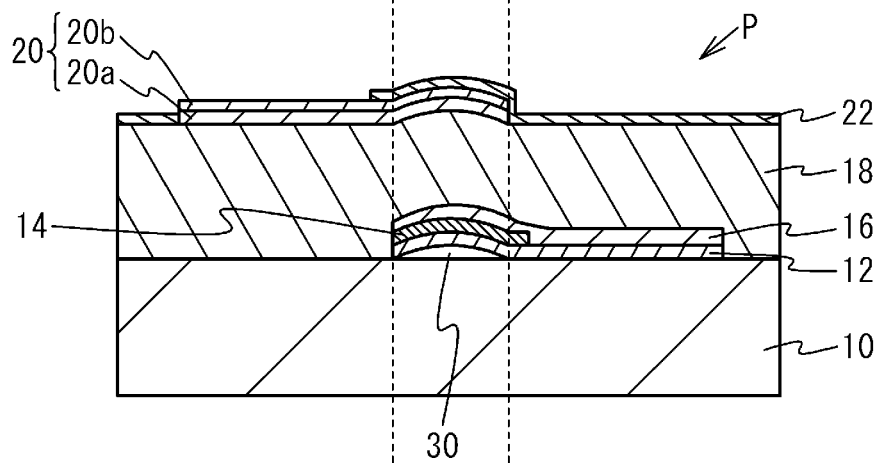
FIG. 1C
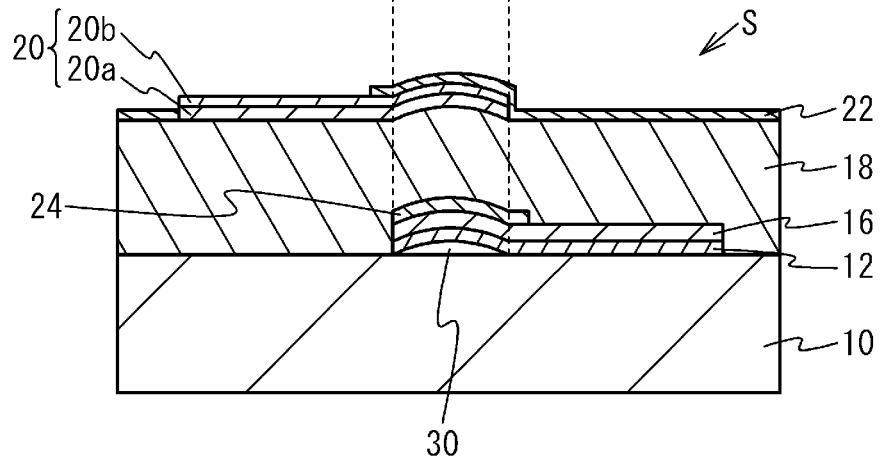

ACOUSTIC WAVE FILTER AND DUPLEXER

CROSS-REFERENCE TO RELATED APPLICATION

This application is based upon and claims the benefit of priority of the prior Japanese Patent Application No. 2013-238180, filed on Nov. 18, 2013, the entire contents of which are incorporated herein by reference.

FIELD

A certain aspect of the present invention relates to an acoustic wave filter and a duplexer.

BACKGROUND

An acoustic wave filter is used for a filter and a duplexer that are provided in a high frequency circuit of a wireless device such as a mobile phone. There is a bulk acoustic wave (BAW) filter having a plurality of piezoelectric thin film resonators on a substrate in which a lower electrode and an upper electrode sandwich a piezoelectric film and face with each other, as an example of an acoustic wave filter.

There is known a piezoelectric thin film resonator in which a temperature compensation film that has an elastic constant of a temperature coefficient of which sign is opposite to a sign of a temperature coefficient of an elastic constant of a piezoelectric film and is inserted in the piezoelectric film in order to improve a temperature coefficient of frequency (TCF) (for example, with reference to Japanese Patent Application Publication No. S58-137317. However, there is a trade-off relationship between a temperature coefficient of frequency and an electromechanical coupling coefficient. Therefore, when a temperature compensation film is provided in order to improve the temperature coefficient of frequency, the electromechanical coefficient may be reduced. Therefore, in an acoustic wave filter using a piezoelectric thin film resonator having a temperature compensation film, a band width of the filter may be reduced. And so, there is proposed an acoustic wave filter in which there is a thickness difference of a temperature compensation film between a series resonator and a parallel resonator (with reference to Japanese Patent Application Publication No. 2004-193929). And, in order to adjust a frequency of the series resonator and the parallel resonator, there is proposed a structure in which a thickness of a frequency adjusting layer on an upper electrode of a series resonator is different from that of the frequency adjusting layer on an upper electrode of a parallel resonator (with reference to Japanese Patent Application Publication No. 2002-268644).

SUMMARY OF THE INVENTION

According to an aspect of the present invention, there is provided an acoustic wave filter including series resonators and parallel resonators that have a piezoelectric film on an identical substrate and have a lower electrode and an upper electrode that sandwich the piezoelectric film and face with each other, wherein: one of the series resonators and the parallel resonators have a temperature compensation film on a face of the lower electrode or the upper electrode that is opposite to the piezoelectric film in a resonance region in which the lower electrode and the upper electrode sandwich the piezoelectric film and face with each other, the compensation film having an elastic constant of a temperature coefficient of which sign is opposite to a sign of a tempera- ture coefficient of an elastic constant of the piezoelectric film; and the other of the series resonators and the parallel resonators have an added film on the same side as the temperature compensation film on the lower electrode side or the upper electrode side compared to the piezoelectric film in the resonance region in the one of the series resonators and the parallel resonators.

According to another aspect of the present invention, there is provided a duplexer including: a transmit filter; and a receive filter, wherein at least one of the transmit filter and the receive filter has an acoustic wave filter, the acoustic wave filter comprising series resonators and parallel resonators that have a piezoelectric film on an identical substrate and have a lower electrode and an upper electrode that sandwich the piezoelectric film and face with each other, wherein: one of the series resonators and the parallel resonators have a temperature compensation film on a face of the lower electrode or the upper electrode that is opposite to the piezoelectric film in a resonance region in which the lower electrode and the upper electrode sandwich the piezoelectric film and face with each other, the compensation film having an elastic constant of a temperature coefficient of which sign is opposite to a sign of a temperature coefficient of an elastic constant of the piezoelectric film; and the other of the series resonators and the parallel resonators have an added film on the same side as the temperature compensation film on the lower electrode side or the upper electrode side compared to the piezoelectric film in the resonance region in the one of the series resonators and the parallel resonators.

BRIEF DESCRIPTION OF THE DRAWINGS

FIG. 1A illustrates a top view of a piezoelectric thin film resonator used for a ladder type filter in accordance with a first embodiment;

FIG. 1B and FIG. 1C illustrate a cross sectional view taken along a line A-A of FIG. 1A;

DETAILED DESCRIPTION

Figure 2:
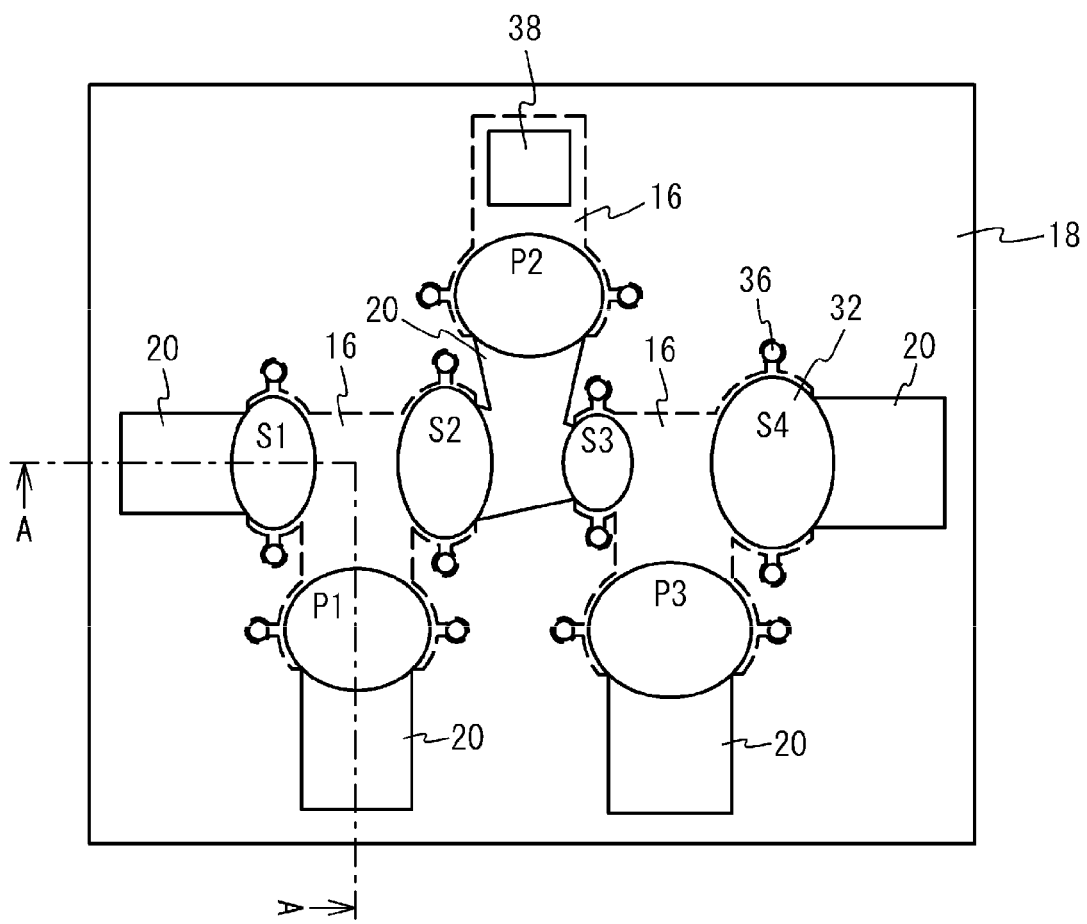
FIG. 2 illustrates a top view of a ladder type filter in accordance with a first embodiment.

When a temperature compensation film is inserted in a piezoelectric film, a reduction amount of the electromechanical coefficient is large. Therefore, it is preferable that the temperature compensation film is provided on a face of the lower electrode or the upper electrode that is opposite to the piezoelectric film. However, in this case, when a thickness of a temperature compensation film of a series resonator is different from that of the temperature compensation film of a parallel resonator or a temperature compensation film is provided in only one of the series resonator and the parallel resonator, the substrate or the piezoelectric film may be ground and there may be a bad effect on reliability.

A description will be given of embodiments with reference to drawings.

[First Embodiment]

A description will be given of a piezoelectric thin film resonator used for a ladder type filter in accordance with a first embodiment. FIG. 1A illustrates a top view of the piezoelectric thin film resonator used for the ladder type filter in accordance with the first embodiment. FIG. 1B and FIG. 1C illustrate a cross sectional view taken along a line A-A of FIG. 1A. FIG. 1B illustrates a cross sectional view of a parallel resonator of the ladder type filter. FIG. 1C illustrates a cross sectional view of a series resonator of the ladder type filter.

As illustrated in FIG. 1A and FIG. 1B, the parallel resonator P has a high acoustic impedance film 12 on a substrate 10 that is a silicon (Si) substrate or the like. A temperature compensation film 14 is provided on the high acoustic impedance film 12. The temperature compensation film 14 covers a whole of a resonance region 32 described later and extends to outside of the resonance region 32 from the resonance region 32. A lower electrode 16 is provided on the temperature compensation film 14 and the high acoustic impedance film 12. In FIG. 1B, the temperature compensation film 14 has a different shape from the high acoustic impedance film 12 and the lower electrode 16, and is not provided in at least a part of an extraction portion of the lower electrode 16 extending from the resonance region 32. However, the temperature compensation film 14 may have the same shape as the high acoustic impedance film 12 and the lower electrode 16. That is, the temperature compensation film 14 may be provided on the extraction portion of the lower electrode 16.

The high acoustic impedance film 12 has higher acoustic impedance than the temperature compensation film 14. The high acoustic impedance film 12 is, for example, a Cr (chrome) film. The temperature compensation film 14 has an elastic constant of a temperature coefficient of which sing is opposite to that of a temperature coefficient of an elastic constant of a piezoelectric film 18 described later. The temperature compensation film 14 is a film of silicon oxide in which fluorine (F) is doped (SiOF). The lower electrode 16 is, for example, a ruthenium (Ru) film.

A cavity 30 having a dome-shaped bulge on the side of the high acoustic impedance film 12 between a flat upper face of the substrate 10 and the high acoustic impedance film 12. The dome-shaped bulge is a bulge in which a height of the cavity 30 around the cavity 30 is low, and the cavity 30 is higher inside of the cavity 30.

The piezoelectric film 18 having a main component of aluminum nitride (AlN) of which main axis is (002) direction is provided on the lower electrode 16 and the substrate 10. Edge faces of the high acoustic impedance film 12, the temperature compensation film 14 and the lower electrode 16 form an identical plane. The piezoelectric film 18 covers the edge faces of the high acoustic impedance film 12, the temperature compensation film 14 and the lower electrode 16.

An upper electrode 20 is provided on the piezoelectric film 18 so that a region (resonance region 32) in which the lower electrode 16 and the upper electrode 20 sandwich the piezoelectric film 18 and face with each other is provided. The upper electrode 20 has a lower layer 20a and an upper layer 20b. The lower layer 20a is, for example, a Ru film. The upper layer 20b is, for example, a Cr film. The resonance region 32 has an ellipse shape and is a region in which an acoustic wave of a thickness longitudinal oscillation mode resonates.

A passivation film 22 is provided on the upper electrode 20 and the piezoelectric film 18 so as to include the resonance region 32. The passivation film 22 is a silicon oxide film or the like. A lamination film in the resonance region 32 includes the high acoustic impedance film 12, the temperature compensation film 14, the lower electrode 16, the piezoelectric film 18, the upper electrode 20 and the passivation film 22. The passivation film 22 may acts as a film for adjusting a frequency.

A guide path 34 for etching a sacrifice layer is formed in the lower electrode 16 and the high acoustic impedance film 12. The sacrifice layer is a layer for forming the cavity 30. The piezoelectric film 18 does not cover a vicinity of an edge of the guide path 34. A hole portion 36 is formed at the vicinity of the edge of the guide path 34.

As illustrated in FIG. 1A and FIG. 1C, the series resonator S is different from the parallel resonator P in points that the temperature compensation film 14 is not provided and an added film 24 is provided between the lower electrode 16 and the piezoelectric film 18. The added film 24 covers the whole of the resonance region 32 and extends toward outside of the resonance region 32 from the resonance region 32, as in the case of the temperature compensation film 14. The size and the shape of the added film 24 are the same as those of the temperature compensation film 14. The added film 24 may have the same shape as the high acoustic impedance film 12 and the lower electrode 16. Edge faces of the high acoustic impedance film 12, the lower electrode 16 and the added film 24 form an identical plane. The piezoelectric film 18 covers the edge faces of the high acoustic impedance film 12, the lower electrode 16 and the added film 24. The added film 24 is, for example, made of the same piezoelectric material as the piezoelectric film 18 and has aluminum nitride having a main axis of (002) direction as a main component. The lamination film in the resonance region 32 includes the high acoustic impedance film 12, the lower electrode 16, the added film 24, the piezoelectric film 18, the upper electrode 20 and the passivation film 22. Other structures are the same as the parallel resonator P of FIG. 1B. Therefore, an explanation of the structures is omitted.

The added film 24 made of the same piezoelectric material as the piezoelectric film 18 is provided in the resonance region 32 of the series resonator S. Therefore, a thickness of a piezoelectric material (the piezoelectric film 18 and the added film 24) in the resonance region 32 of the series resonator S is larger than a thickness of a piezoelectric material (the piezoelectric film 18) in the resonance region 32 of the parallel resonator P.

A resonance frequency of both the series resonator S and the parallel resonator P is adjusted by adjusting the thickness of the passivation film 22. A resonance frequency difference between the series resonator S and the parallel resonator P can be adjusted by the thickness of the added film 24 or the like. Thus, a desirable resonance frequency difference can be achieved between the parallel resonator P and the series resonator S. And, desirable band pass characteristic can be achieved in the ladder type filter.

In FIG. 1A to FIG. 1C, the parallel resonator P has the temperature compensation film 14, but the series resonator S does not have the temperature compensation film 14. This is because of the following reasons. That is, the parallel resonator of the ladder type filter mainly has influence on skirt characteristic on a low frequency side of a pass band. The series resonator S mainly has influence on the skirt characteristic on a high frequency side of the pass band. When both the parallel resonator P and the series resonator S have the temperature compensation film 14, temperature coefficients of frequency of both of the low frequency side and the high frequency side of the pass band can be improved.

However, as mentioned above, the temperature coefficient of frequency and the electromechanical coupling coefficient have a trade-off relationship. Therefore, when the temperature compensation film 14 is provided, the electromechanical coupling coefficient gets smaller. For example, a description will be given of a case where a ladder type filter using the parallel resonator P and the series resonator S is manufactured. The parallel resonator P is manufactured with use of a Cr film having a thickness of 100 nm as the high acoustic impedance film 12, a SiOF film having a thickness of 210 nm as the temperature compensation film 14, a Ru film having a thickness of 160 nm as the lower electrode 16, an AlN film having a thickness of 1170 nm as the piezoelectric film 18, a Ru film having a thickness of 220 nm as the lower layer 20a of the upper electrode 20, a Cr film having a thickness of 30 nm as the upper layer 20b, and a SiOx film having a thickness of 50 nm as the passivation film 22. The series resonator S is manufactured with use of the high acoustic impedance film 12, the lower electrode 16, the piezoelectric film 18, the upper electrode 20 and the passivation film 22 having the same thickness and the same material as the parallel resonator P and with use of an AlN film having a thickness of 180 nm as the added film 24. In this case, the temperature coefficient of frequency of the parallel resonator P is −10 ppm/° C. The electromechanical coupling coefficient of the parallel resonator P is 6%. On the other hand, the temperature coefficient of frequency of the series resonator S is −30 ppm/° C. The electromechanical coupling coefficient of the series resonator S is 7.2%.

In this manner, the temperature coefficient of frequency of the parallel resonator P having the temperature compensation film 14 is good, but the electromechanical coupling coefficient of the parallel resonator P is small. On the other hand, the temperature coefficient of frequency of the series resonator S not having the temperature compensation film 14 is worse than that of the parallel resonator P, but the electromechanical coupling coefficient of the series resonator S is larger that of the parallel resonator P. And so, it is thought of a structure in which a temperature compensation film is provided in a resonator having influence on one of the low frequency side and the high frequency side of the pass band of which improvement of the temperature coefficient of frequency is desired (for example, a guard band side) in order to enlarge the electromechanical coupling coefficient and improve the temperature coefficient of frequency. Therefore, in FIG. 1A to FIG. 1C, the temperature compensation film 14 is provided in the parallel resonator P in order to improve the temperature coefficient of frequency on the low frequency side of the pass band. And, in order to enlarge the electromechanical coupling coefficient, the temperature compensation film 14 is not provided in the series resonator S.

For example, a quartz substrate, a glass substrate, a ceramics substrate, a GaAs substrate or the like other than the Si substrate may be used as the substrate 10. A film of which acoustic impedance is higher than that of the temperature compensation film 14 can be used as the high acoustic impedance film 12. For example, a Ru film, an AlN film, a silicon nitride film or the like other than the Cr film may be used as the high acoustic impedance film 12.

A film having an elastic constant of a temperature coefficient of which sine is opposite to that of a temperature coefficient of an elastic constant of the piezoelectric film 18 can be used as the temperature compensation film 14. A film having silicon oxide or silicon nitride as a main component other than the SiOF film may be used as the temperature compensation film 14. The temperature compensation film 14 may have silicon oxide as a main component as in the case of the SiOF film, and may include another element such as fluorine in order to enlarge the temperature coefficient of the elastic constant. This is because, when the temperature coefficient of the elastic constant of the temperature compensation film 14 is large, the thickness of the temperature compensation film 14 for achieving the same temperature coefficient of frequency can be reduced and the electromechanical coupling coefficient can be enlarged.

A single layer metal film such as aluminum (Al), titanium (Ti), copper (Cu), Molybdenum (Mo), tungsten (W), tantalum (Ta), platinum (Pt), rhodium (Rh), iridium (Ir) or the like other than Ru and Cr, or a lamination metal film of these single layer metal films can be used as the lower electrode 16 and the upper electrode 20. Zinc oxide (ZnO), lead zirconate titanate (PZT), lead titanate ($PbTiO_3$) or the like other than aluminum nitride can be used as the piezoelectric film 18. The piezoelectric film 18 may have aluminum nitride as a main component and may include another element in order to improve resonance characteristic or piezoelectricity. For example, when scandium or the like is used as a dopant element, the piezoelectricity of the piezoelectric film 18 can be improved, and an effective electromechanical coupling constant of the piezoelectric thin film resonator can be improved.

An insulating film such as a silicon nitride film or an aluminum nitride film other than the silicon oxide film can be used as the passivation film 22. An insulating film or a metal film may be used as the added film 24. However, from a viewpoint of characteristic, it is preferable that the added film 24 is made of a piezoelectric material. For example, it is preferable that the added film 24 is made of the same piezoelectric material as the piezoelectric film 18.

FIG. 2 illustrates a top view of the ladder type filter in accordance with the first embodiment. In FIG. 2, the passivation film 22 and so on are seen through. As illustrated in FIG. 2, the ladder type filter of the first embodiment has a plurality of series resonators S1 to S4 and a plurality of parallel resonators P1 to P3 on the same substrate 10. The plurality of series resonators S1 to S4 are connected in series between an input terminal and an output terminal. The plurality of parallel resonators P1 to P3 are connected in parallel between the input terminal and the output terminal. The plurality of series resonator S1 to S4 have the same structure as the piezoelectric thin film resonator S illustrated in FIG. 1C. The plurality of parallel resonators P1 to P3 have the same structure as the piezoelectric thin film resonator P illustrated in FIG. 1B. An opening 38 is formed in the piezoelectric film 18. Thus, the lower electrode 16 can be electrically connected with an outer component. The number of the series resonator and the parallel resonator, the shape and the size of the resonance region, and the material and the thickness of the resonator can be arbitrarily changed according to a spec.

Figure 3A:
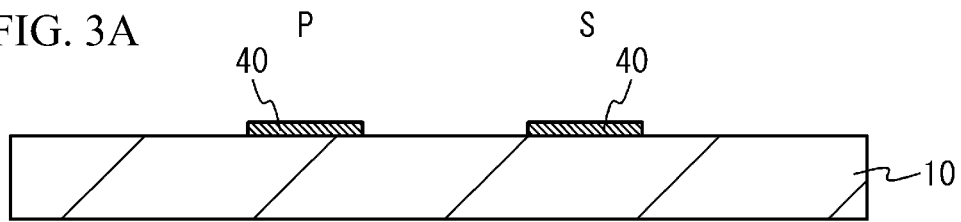
FIG. 3A to FIG. 3E illustrate a cross sectional view describing a manufacturing method of a ladder type filter in accordance with a first embodiment.

A description will be given of a manufacturing method of the ladder type filter in accordance with the first embodiment. FIG. 3A to FIG. 4C illustrate a cross sectional view describing the manufacturing method of the ladder type filter in accordance with the first embodiment. FIG. 3A to FIG. 4C illustrate a cross sectional view corresponding to a portion taken along a line A-A of FIG. 2. As illustrated in FIG. 3A, a sacrifice layer 40 for forming the cavity 30 is formed on the flat upper face of the substrate 10. The sacrifice layer 40 is formed by a sputtering method, a vacuum vapor deposition method or the like. For example, magnesium oxide (MgO), Zinc oxide (ZnO), germanium (Ge) or silicon oxide (SiOx) that easily dissolve in etching liquid or etching gas may be used as the sacrifice layer 40. A thickness of the sacrifice layer 40 is, for example, 10 nm to 100 nm. After that, the sacrifice layer 40 is subjected to a patterning with use of a photolithography technology and an etching technology and is formed into a desirable shape. The shape of the sacrifice layer 40 corresponds to a plane shape of the cavity 30 and includes the resonance region 32, for example.

Figure 3B:
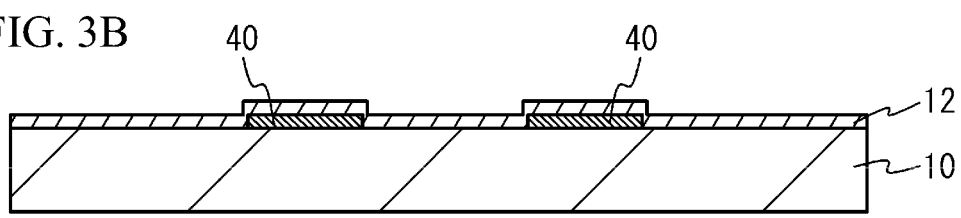

As illustrated in FIG. 3B, the high acoustic impedance film 12 is formed on the sacrifice layer 40 and the substrate 10. The high acoustic impedance film 12 is formed by a sputtering method, a vacuum vapor deposition method or the like.

Figure 3C:
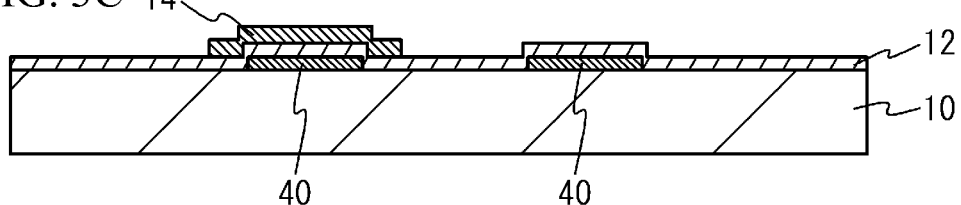

As illustrated in FIG. 3C, the temperature compensation film 14 is formed on the high acoustic impedance film 12. The temperature compensation film 14 is formed by a sputtering method or a CVD (Chemical Vapor Deposition) method. After that, the temperature compensation film 14 is subjected to a patterning with use of a photolithography technology and an etching technology and is formed into a desirable shape. For example, the temperature compensation film 14 is subjected to a patterning so that a part of the temperature compensation film 14 that is larger than the sacrifice layer 40 (that is, larger than the resonance region 32) is left on the sacrifice layer 40 of the parallel resonator P. And the temperature compensation film 14 on the series resonator S side is removed. The part of the temperature compensation film 14 that is larger than the resonance region 32 is left from a viewpoint of accuracy of positioning.

Figure 3D:
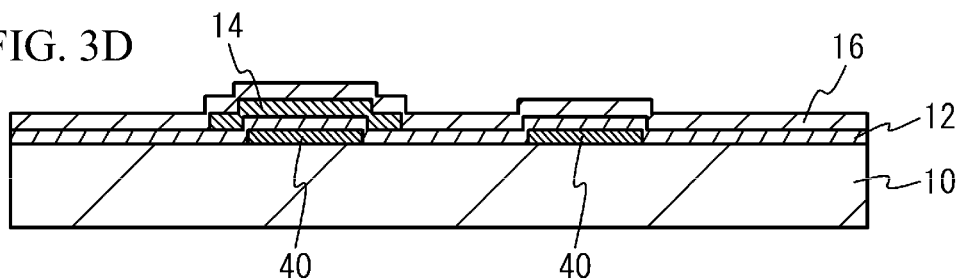

As illustrated in FIG. 3D, the lower electrode 16 is formed on the high acoustic impedance film 12 and the temperature compensation film 14. The lower electrode 16 is formed by a sputtering method or a vacuum vapor deposition method.

Figure 3E:
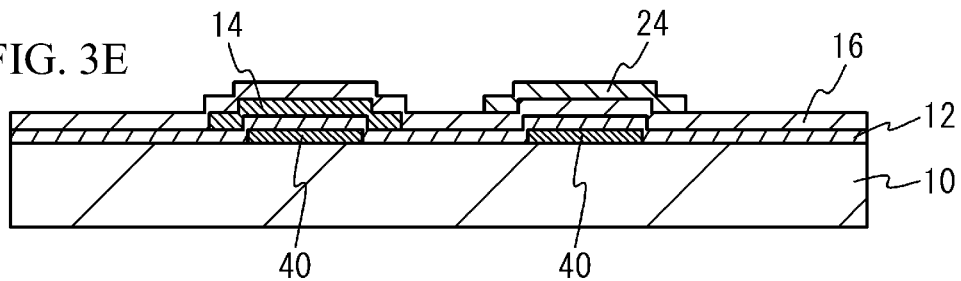

As illustrated in FIG. 3E, the added film 24 is formed on the lower electrode 16. The added film 24 is formed by a sputtering method or a CVD method. After that, the added film 24 is subjected to a patterning with use of a lithography technology and an etching technology and is formed into a desirable shape. For example, the added film 24 is subjected to a patterning so that a part of the added film 24 that is larger than the sacrifice layer 40 (that is, larger than the resonance region 32) is left on the sacrifice layer 40. And, the added film 24 on the parallel resonator P side is removed. It is preferable that the added film 24 has the same size and the same shape as the temperature compensation film 14.

Figure 4A:
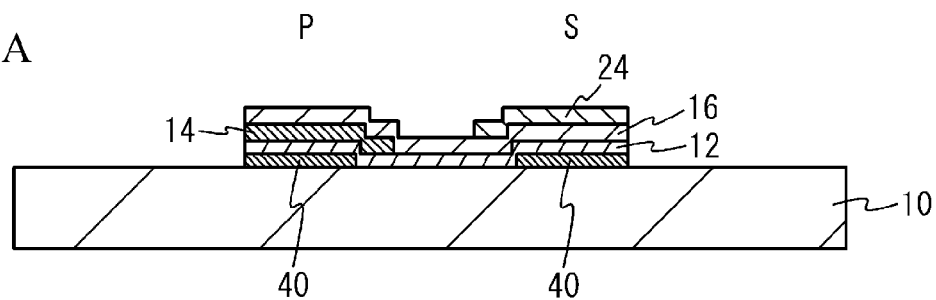
FIG. 4A to FIG. 4C illustrate a cross sectional view describing a manufacturing method of a ladder type filter in accordance with a first embodiment.

As illustrated in FIG. 4A, the high acoustic impedance film 12, the temperature compensation film 14, the lower electrode 16 and the added film 24 are formed by an integral processing with use of a photolithography technology and an etching technology and is formed into a desirable shape. Thus, in the parallel resonator P, edge faces of the high acoustic impedance film 12, the temperature compensation film 14 and the lower electrode 16 form an identical face. In the series resonator S, edge faces of the high acoustic impedance film 12, the lower electrode 16 and the added film 24 form an identical face. It is preferable that an ion milling method is used as the etching technology. This is because the etching is performed with respect to a plurality of materials of the high acoustic impedance film 12, the temperature compensation film 14, the lower electrode 16 and the added film 24. The ion milling method is a physical etching. Therefore, when a film thickness difference between the parallel resonator P and the series resonator S is large, the substrate 10 is etched in the resonator having a smaller film thickness. Therefore, a large step gap occurs around an edge of the lower electrode 16 or the like. For example, when the series resonator S does not have the added film 24, a film thickness difference corresponding to the temperature compensation film 14 occurs between the parallel resonator P and the series resonator S. Therefore, the substrate 10 is etched in the series resonator S. Therefore, a large step gap occurs around the edge of the lower electrode 16 or the like. In this case, when the cavity 30 is formed between the substrate 10 and the high acoustic impedance film 12, a crack tends to occur in the piezoelectric film 18 or the like from the step gap that acts as a base point. And, reliability may be damaged. And so, the added film 24 is formed in the series resonator S, and the film thickness difference between the parallel resonator P and the series resonator S is reduced. Thereby, the etching of the substrate 10 is suppressed.

Figure 4B:
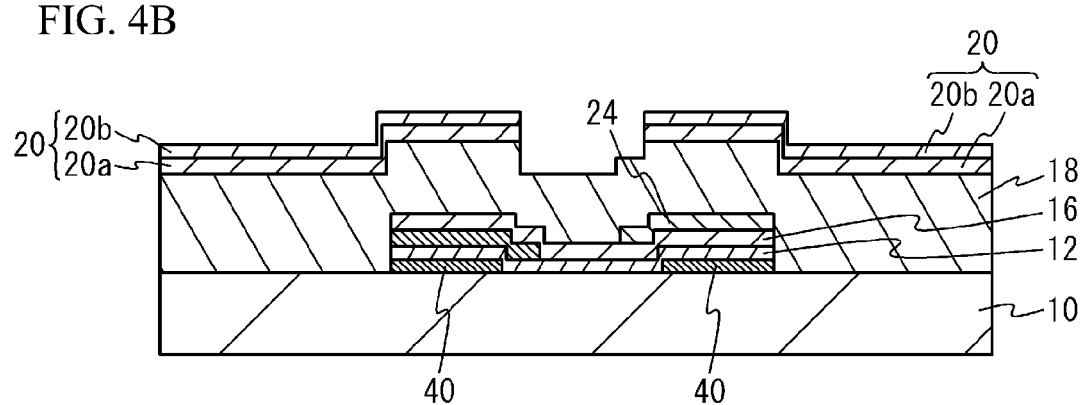

As illustrated in FIG. 4B, the piezoelectric film 18 is formed on the lower electrode 16, the added film 24 and the substrate 10. The piezoelectric film 18 is formed by a sputtering method, a CVD method or the like. The lower layer 20a and the upper layer 20b are formed on the piezoelectric film 18 as the upper electrode 20. The upper electrode 20 is formed by a sputtering method, a vacuum vapor deposition method, or the like. After that, the upper electrode 20 and the piezoelectric film 18 are subjected to a patterning with use of a photolithography technology and an etching technology and is formed into a desirable shape.

Figure 4C:
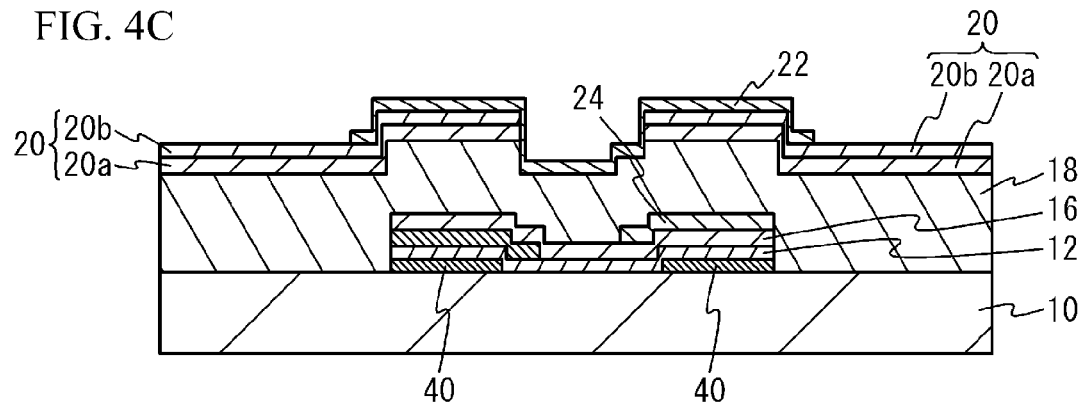

As illustrated in FIG. 4C, the passivation film 22 is formed on the upper electrode 20. The passivation film 22 is formed by a sputtering method, a CVD method or the like. After that, the passivation film 22 is subjected to a patterning with use of a photolithography technology and an etching technology and is formed into a desirable shape.

After forming the passivation film 22, the etching liquid of the sacrifice layer 40 is guided to the sacrifice layer 40 under the high acoustic impedance film 12 via the hole portion 36 and the guide path 34 (with reference to FIG. 1A). Thus, the sacrifice layer 40 is removed. It is preferable that medium for etching the sacrifice layer 40 is medium that does not etch materials forming the resonator other than the sacrifice layer 40. For example, it is preferable that the etching medium is medium that does not etch the high acoustic impedance film 12 or the like to which the etching medium contacts. When the sacrifice layer 40 of the parallel resonator P is removed under a condition that stress of the lamination film including the high acoustic impedance film 12, the temperature compensation film 14, the lower electrode 16, the piezoelectric film 18 and the upper electrode 20 of the parallel resonator P is compression stress, the lamination film expands toward the opposite side of the substrate 10 so as to get away from the substrate 10. Similarly, when the sacrifice layer 40 of the series resonator S is removed under a condition that the lamination film including the high acoustic impedance film 12, the lower electrode 16, the added film 24, the piezoelectric film 18 and the upper electrode 20 is compression stress, the lamination film expands toward the opposite side of the substrate 10 so as to get away from the substrate 10. Thus, the cavity 30 having the dome-shaped bulge between the substrate 10 and the high acoustic impedance film 12 is formed. With the processes, the ladder type filter of the first embodiment is formed.

In the ladder type filter of the first embodiment, the parallel resonator P has the temperature compensation film 14 on the face of the lower electrode 16 that is opposite to the piezoelectric film 18 in the resonance region 32 as illustrated in FIG. 1B. The series resonator S does not have the temperature compensation film on the face of the lower electrode 16 that is opposite to the piezoelectric film 18 in the resonance region 32 but has the added film 24 on the same side as the temperature compensation film 14 (that is, the side of the lower electrode 16) of the parallel resonator P on the lower electrode 16 side or the upper electrode 20 side compared to the piezoelectric film 18. With the structure, as described with reference to FIG. 4A, the etching of the substrate 10 caused by the film thickness difference between the series resonator S and the parallel resonator P is suppressed. Therefore, occurrence of the crack in the piezoelectric film 18 or the like is suppressed, and the reliability may be improved.

It is preferable that the added film 24 provided between the lower electrode 16 and the piezoelectric film 18 is made of a piezoelectric material, from a viewpoint of characteristic. In this case, the thickness of the piezoelectric material of the resonance region 32 in the series resonator S is larger than the thickness of the piezoelectric material of the resonance region 32 in the parallel resonator P.

When the piezoelectric film 18 extends from on the lower electrode 16 to on the substrate 10 so as to cover an edge face of the lower electrode 16 or the like as illustrated in FIG. 1B and FIG. 1C and the substrate 10 around the edge of the lower electrode 16 or the like is subjected to an etching, a crack tends to occur in the piezoelectric film 18 or the like. It is therefore preferable that the added film 24 is provided in the structure.

As illustrated in FIG. 1B, it is preferable that the high acoustic impedance film 12 is provided on the face of the temperature compensation film 14 that is opposite to the piezoelectric film 18. This is because the Q value can be improved by the following reasons. That is, when the high acoustic impedance film 12 is not provided, acoustic wave energy is confined between the temperature compensation film 14 and the passivation film 22. Intensity of the acoustic wave energy gets weaker as the acoustic wave gets closer to the temperature compensation film 14 and the passivation film 22. Therefore, the temperature compensation film 14 is provided in a portion in which the acoustic wave energy is small. In order to improve the temperature coefficient of frequency, it is necessary to enlarge the thickness of the temperature compensation film 14. On the other hand, when the high acoustic impedance film 12 is provided, the acoustic wave energy is confined between the high acoustic impedance film 12 and the passivation film 22. Therefore, the temperature compensation film 14 is provided in a portion in which the acoustic wave energy is larger, compared to the case where the high acoustic impedance film 12 is not provided. Thereby, the film thickness for improving the temperature coefficient of frequency can be reduced. In this manner, when the high acoustic impedance film 12 is provided, the film thickness of the temperature compensation film 14 for improving the temperature coefficient of frequency can be reduced. Thereby, the Q value of the resonance frequency and the anti-resonance frequency can be improved.

As illustrated in FIG. 1B, it is preferable that the temperature compensation film 14 is not provided on at least a part of the extraction portion of the lower electrode 16 extending from the resonance region 32. This is because the adhesion between the temperature compensation film 14 and the lower electrode 16 is not good, and the lower electrode 16 may be peeled when an upper face of the lower electrode 16 is subjected to a bonding.

[Second Embodiment]

Figure 5A:
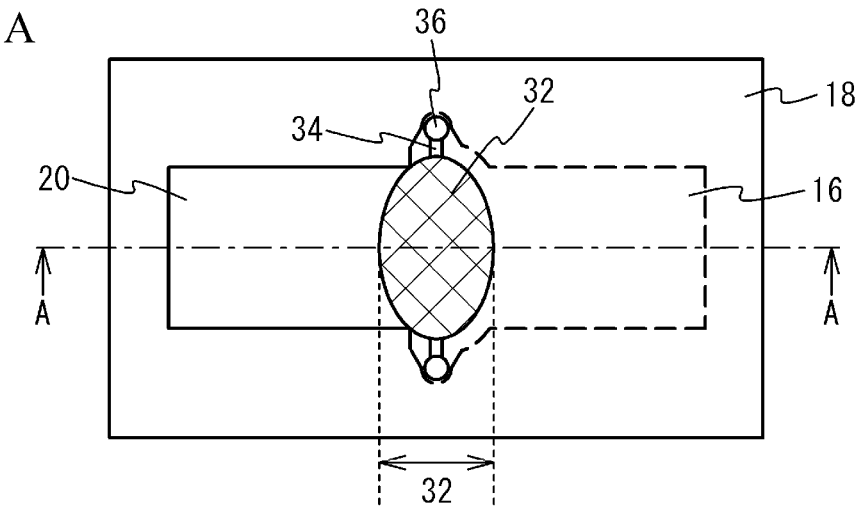
FIG. 5A illustrates a top view of a piezoelectric thin film resonator used for a ladder type filter of a second embodiment.
Figure 5B:
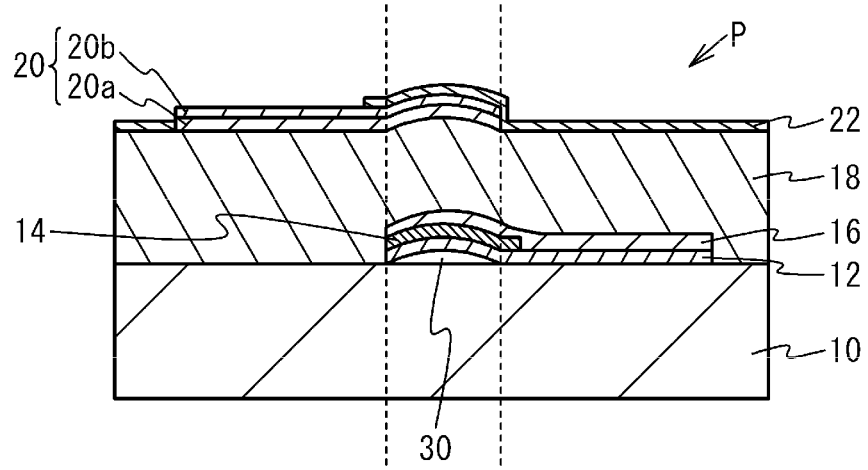
FIG. 5B and FIG. 5C illustrate a cross sectional view taken along a line A-A of FIG. 5A.
Figure 5C:
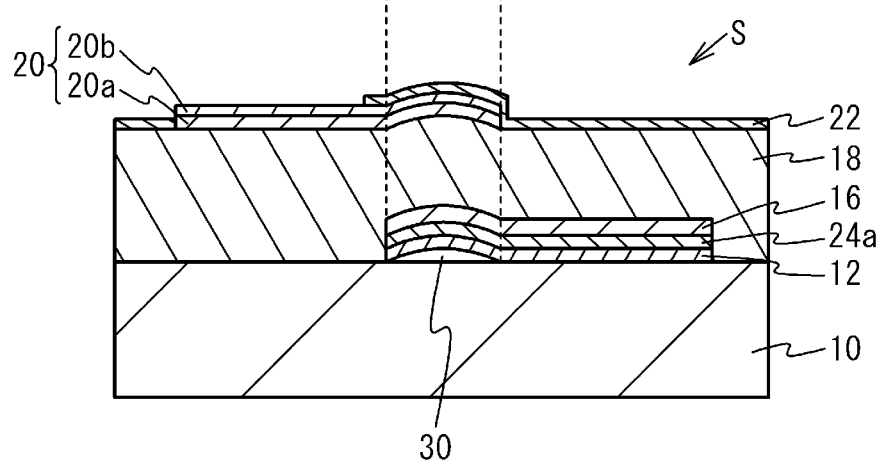

A top view of a ladder type filter in accordance with a second embodiment is the same as FIG. 2 of the first embodiment. Therefore, an explanation of the top view is omitted. FIG. 5A illustrates a top view of a piezoelectric thin film resonator used for the ladder type filter of the second embodiment. FIG. 5B and FIG. 5C illustrate a cross sectional view taken along a line A-A of FIG. 5A. FIG. 5B illustrates a cross sectional view of a parallel resonator of the ladder type filter. FIG. 5C illustrates a cross sectional view of a series resonator of the ladder type resonator.

As illustrated in FIG. 5A to FIG. 5C, in the series resonator S, an added film 24a is, for example, made of a Cr film and is provided between the lower face of the lower electrode 16 and an upper face of the high acoustic impedance film 12. A single layer metal film such as Ru, Al, Cu, Ti, Mo, W, Ta, Pt, Rh or Jr or a lamination metal film of these single layer metal films other than Cr may be used as the added film 24a. An insulating film may be used as the added film 24a. Other structures are the same as FIG. 1A to FIG. 1C of the first embodiment. Therefore, an explanation of the structures is omitted.

In the ladder type filter of the second embodiment, the parallel resonator P has the temperature compensation film 14 on the face of the lower electrode 16 that is opposite to the piezoelectric film 18 in the resonance region 32, as illustrated in FIG. 5B. The series resonator S has the added film 24a on the same side (that is, the lower electrode 16 side) as the temperature compensation film 14 of the parallel resonator P on the lower electrode 16 side or the upper electrode 20 side compared to the piezoelectric film 18, as illustrated in FIG. 5C. Therefore, the etching of the substrate 10 can be suppressed as in the case of the first embodiment. And, the occurrence of crack in the piezoelectric film 18 or the like can be suppressed. Thereby, the reliability can be improved.

The added film 24a may be provided on the upper face of the lower electrode 16 instead of the case where the added film 24a is provided on the lower face of the lower electrode 16. For example, when the lower electrode 16 includes a lower layer and an upper layer, the added film 24a may be provided between the layers. That is, the added film 24a may be made of metal contacting the lower electrode 16. In this case, total thickness of the film including the metal under the piezoelectric film 18 in the resonance region 32 of the series resonator S (total thickness of the lower electrode 16, the added film 24a and the high acoustic impedance film 12) is larger than total thickness of the film including the metal under the piezoelectric film 18 in the resonance region 32 of the parallel resonator P (total thickness of the lower electrode 16 and the high acoustic impedance film 12).

[Third Embodiment]

Figure 6A:
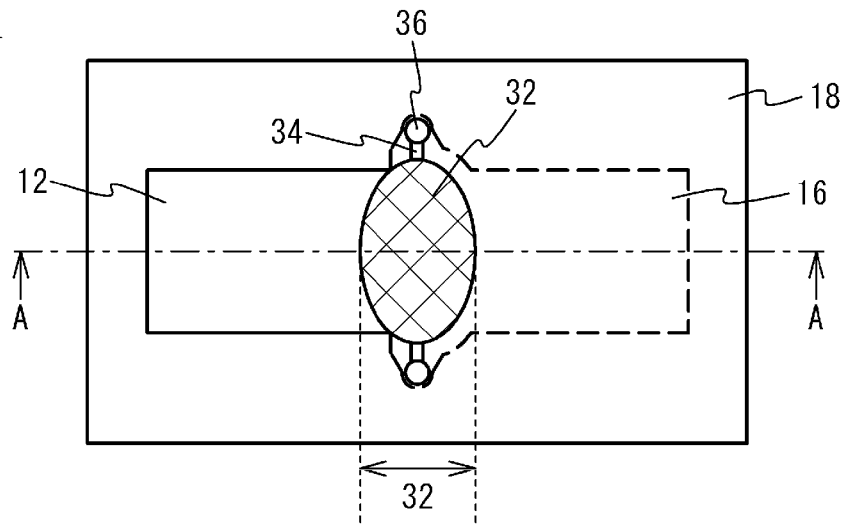
FIG. 6A illustrates a top view of a piezoelectric thin film resonator used for a ladder type filter in accordance with a third embodiment.
Figure 6B:
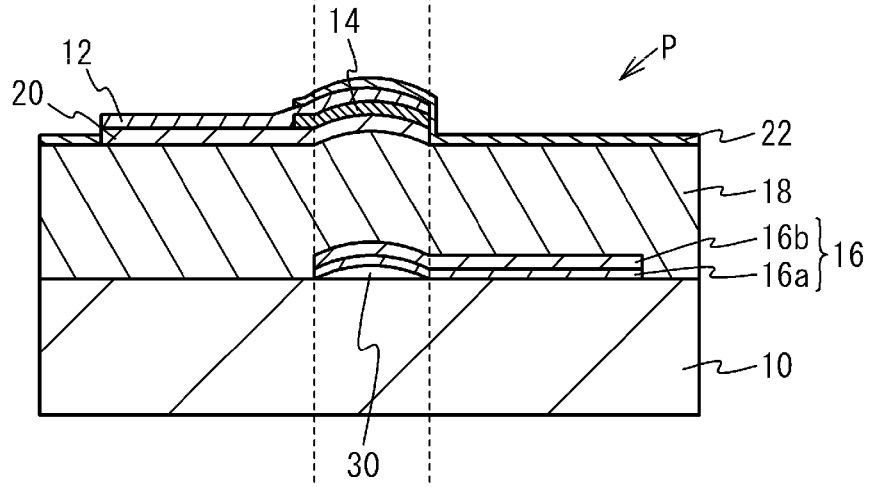
FIG. 6B and FIG. 6C illustrate a cross sectional view taken along a line A-A of FIG. 6A.
Figure 6C:
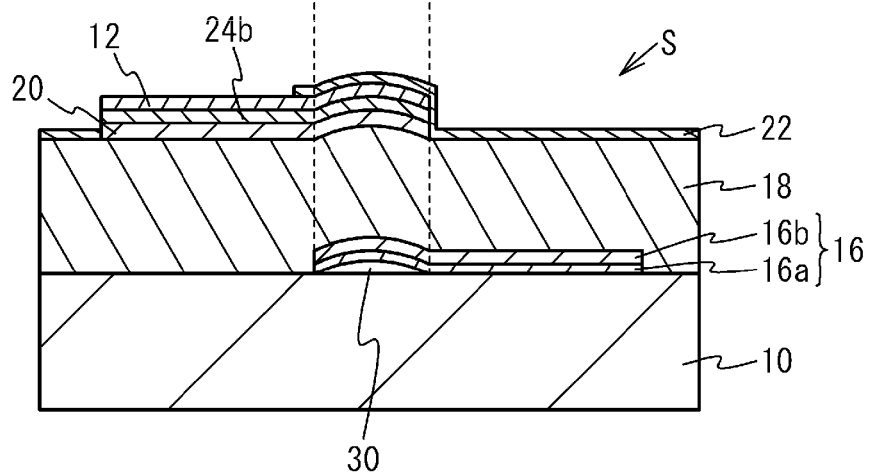

A top view of a ladder type filter in accordance with a third embodiment is the same as FIG. 2 of the first embodiment. Therefore, an explanation of the top view is omitted. FIG. 6A illustrates a top view of a piezoelectric thin film resonator used for the ladder type filter in accordance with the third embodiment. FIG. 6B and FIG. 6C illustrate a cross sectional view taken along a line A-A of FIG. 6A. FIG. 6B illustrates a cross sectional view of a parallel resonator of the ladder type filter. FIG. 6C illustrates a cross sectional view of a series resonator of the ladder type filter.

As illustrated in FIG. 6A to FIG. 6C, the lower electrode 16 includes a lower layer 16a made of a Cr film or the like and an upper layer 16b made of a Ru film or the like. In the parallel resonator P, the temperature compensation film 14 is provided on the upper face of the upper electrode 20 (that is, the face of the upper electrode 20 that is opposite to the piezoelectric film 18). The high acoustic impedance film 12 is provided on the upper face of the temperature compensation film 14 and the upper electrode 20 (that is, the face of the temperature compensation film 14 that is opposite to the piezoelectric film 18). The upper electrode 20 is made of a Ru film or the like. The temperature compensation film 14 is made of a SiOF film or the like. The high acoustic impedance film 12 is made of a Cr film or the like. In the series resonator S, an added film 24b is provided between the upper face of the upper electrode 20 and the lower face of the high acoustic impedance film 12. The added film 24b is made of a Cr film or the like. The material of the added film 24a of the second embodiment may be used for the added film 24b. Other structures are the same as FIG. 1A to FIG. 1C of the first embodiment. Therefore, an explanation of the structures is omitted.

In the ladder type filter of the third embodiment, the parallel resonator P has the temperature compensation film 14 on the face of the upper electrode 20 that is opposite to the piezoelectric film 18 in the resonance region 32 as illustrated in FIG. 6B. The series resonator S has the added film 24b on the same side (that is, the upper electrode 20 side) as the temperature compensation film 14 of the parallel resonator P on the lower electrode 16 side or the upper electrode 20 side compared to the piezoelectric film 18, in the resonance region 32. For example, when the series resonator S does not have the added film 24b, there is a film thickness difference corresponding to the temperature compensation film 14 between the parallel resonator P and the series resonator S. Therefore, when the high acoustic impedance film 12, the upper electrode 20 and the temperature compensation film 14 are subjected to a patterning, the piezoelectric film 18 on the side of the series resonator S may be etched. Thus, the reliability may be degraded. However, in the third embodiment, the film thickness difference between the parallel resonator P and the series resonator S may be reduced by the added film 24b. Therefore, the etching of the piezoelectric film 18 may be suppressed. Thereby, the reliability may be improved.

The added film 24b may be provided on the lower face of the upper electrode 20 instead of the case where the added film 24b is provided on the upper face of the upper electrode 20. For example, when the upper electrode 20 includes a lower layer and an upper layer, the added film 24b may be provided between the layers of the upper electrode 20. That is, the added film 24b may be made of metal contacting the upper electrode 20. In this case, total thickness of the film made of the metal on the piezoelectric film 18 of the resonance region 32 in the series resonator S (total thickness of the upper electrode 20, the added film 24b and the high acoustic impedance film 12) is larger than total thickness of the film made of the metal on the piezoelectric film 18 of the resonance region 32 in the parallel resonator P (total thickness of the upper electrode 20 and the high acoustic impedance film 12).

When the added film 24b is provided on the lower face of the upper electrode 20 (that is, between the upper electrode 20 and the piezoelectric film 18), it is preferable that the added film 24b is made of a piezoelectric material (for example, the same piezoelectric material as the piezoelectric film 18) in order to achieve preferable characteristic. In this case, the thickness of the piezoelectric material of the resonance region 32 in the series resonator S is larger than that of the piezoelectric material of the resonance region 32 in the parallel resonator P.

In the first to third embodiments, the parallel resonator P has the temperature compensation film, and the series resonator S has the added film. However, the parallel resonator P may have the added film, and the series resonator S may have the temperature compensation film. As mentioned above, the parallel resonator mainly has influence on the skirt characteristic of the pass band on the lower frequency side, and the series resonator mainly has influence on the skirt characteristic of the pass band on the higher frequency side. Therefore, the temperature compensation film may be provided in one resonator whose improvement of the temperature coefficient of frequency is desired, and the added film may be provided in the other resonator. Therefore, one of the series resonator and the parallel resonator has a temperature compensation film on a face of a lower electrode or an upper electrode that is opposite to a piezoelectric film in a resonance region. The other of the series resonator and the parallel resonator has an added film on the same side as the temperature compensation film of the one of the series resonator and the parallel resonator on the lower electrode side or the upper electrode side compared to the piezoelectric film, in the resonance region. With the structure, the reliability may be improved.

[Fourth Embodiment]

Figure 7A:
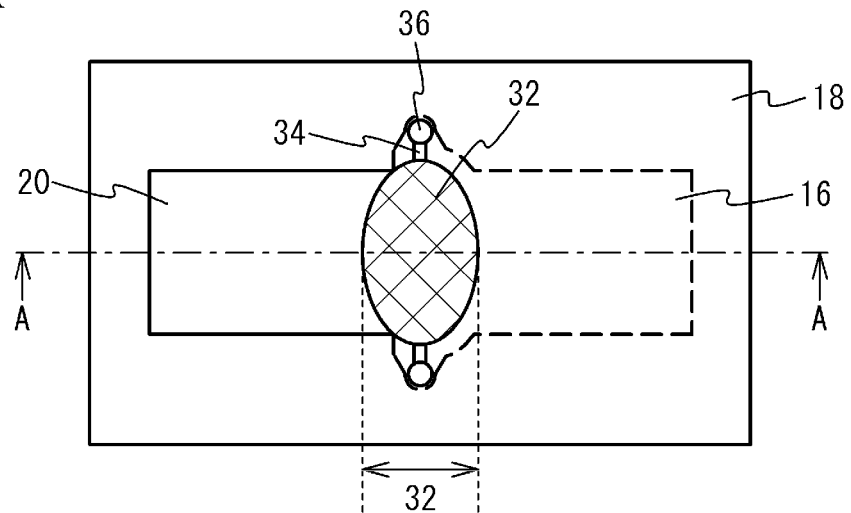
FIG. 7A illustrates a top view of a piezoelectric thin film resonator used for a ladder type filter in accordance with a fourth embodiment.
Figure 7B:
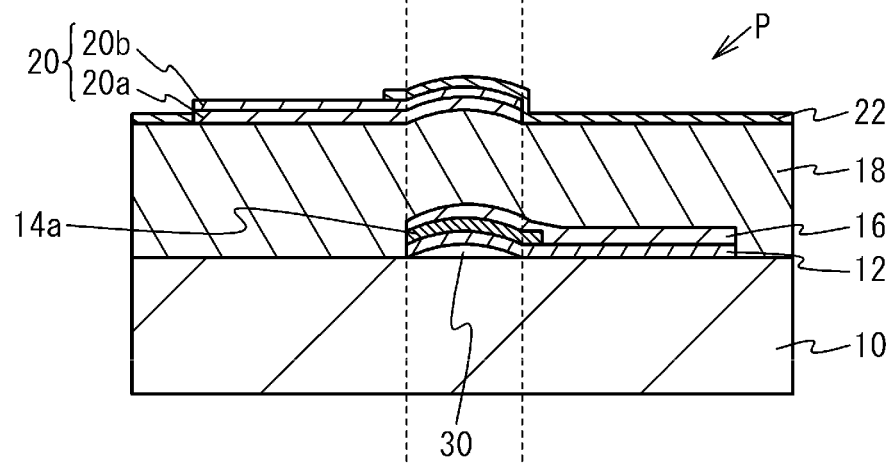
FIG. 7B and FIG. 7C illustrate a cross sectional view taken along a line A-A of FIG. 7A FIG. 8A and FIG. 8B illustrate a cross sectional view of a piezoelectric thin film resonator used for a ladder type filter in accordance with a fifth embodiment.
Figure 7C:
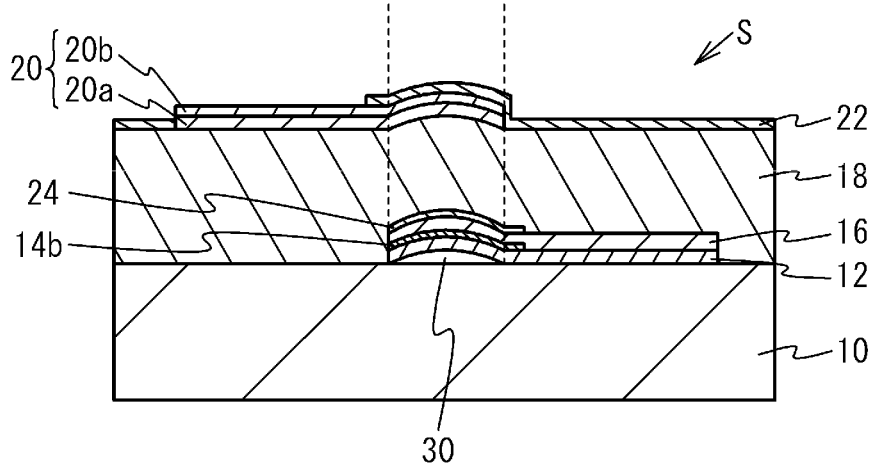

A top view of a ladder type filter in accordance with a fourth embodiment is the same as FIG. 2 of the first embodiment. Therefore, an explanation of the top view is omitted. FIG. 7A illustrates a top view of a piezoelectric thin film resonator used for the ladder type filter in accordance with the fourth embodiment. FIG. 7B and FIG. 7C illustrate a cross sectional view taken along a line A-A of FIG. 7A. FIG. 7B illustrates a cross sectional view of a parallel resonator of the ladder type filter. FIG. 7C illustrates a cross sectional view of a series resonator of the ladder type filter.

As illustrated in FIG. 7A to FIG. 7C, in the fourth embodiment, the parallel resonator P has a temperature compensation film 14a on the face of the lower electrode 16 that is opposite to the piezoelectric film 18. In addition, the series resonator S also has a temperature compensation film 14b on the face of the lower electrode 16 that is opposite to the piezoelectric film 18. The thickness of the temperature compensation film 14b of the series resonator S is smaller than the thickness of the temperature compensation film 14a of the parallel resonator P. Other structures are the same as FIG. 1A to FIG. 1C of the first embodiment. Therefore, an explanation of the structures is omitted.

In the ladder type filter of the fourth embodiment, as illustrated in FIG. 7B and FIG. 7C, the parallel resonator P and the series resonator S respectively have the temperature compensation films 14a and 14b on the face of the lower electrode 16 that is opposite to the piezoelectric film 18 in the resonance region 32. The thickness of the temperature compensation film 14b of the parallel resonator P is larger than the thickness of the temperature compensation film 14a of the series resonator S. In the series resonator S of which thickness of the temperature compensation film is small, the added film 24 is provided on the same side as the temperature compensation film 14 (that is, the lower electrode 16 side) on the lower electrode 16 side or the upper electrode 20 side compared to the piezoelectric film 18, in the resonance region 32. In this case, as in the case of the first embodiment, the etching of the substrate 10 caused by the film thickness difference between the series resonator S and the parallel resonator P can be suppressed. Therefore, the occurrence of the crack in the piezoelectric film 18 or the like may be suppressed. And, the reliability may be improved.

In the fourth embodiment, the added film 24 is provided between the lower electrode 16 and the piezoelectric film 18 as in the case of the first embodiment. However, the added film 24 may be provided on the lower face of the lower electrode 16 as in the case of the second embodiment. The temperature compensation film 14 may be provided on the upper face of the upper electrode 20, and the added film may be provided on the upper face of the upper electrode 20 or between the upper electrode 20 and the piezoelectric film 18 as in the case of the third embodiment.

In the fourth embodiment, the thickness of the temperature compensation film 14b of the parallel resonator P is larger than the thickness of the temperature compensation film 14a of the series resonator S. However, the thickness of the temperature compensation film 14a of the series resonator S may be larger than the thickness of the temperature compensation film 14b of the parallel resonator P. In this case, the added film 24 is provided in the parallel resonator P. From a viewpoint of the temperature coefficient of frequency on the lower frequency side and the higher frequency side of the pass band, one of the thicknesses of the temperature compensation films of the series resonator S and the parallel resonator P may be arbitrarily enlarged. Therefore, one of the temperature compensation films of the series resonator and the parallel resonator is thicker than the other resonator. The other resonator has an added film on the same side of the temperature compensation film on the lower electrode side or the upper electrode side compared to the piezoelectric film. With the structure, the reliability may be improved.

[Fifth Embodiment]

Figure 8A:
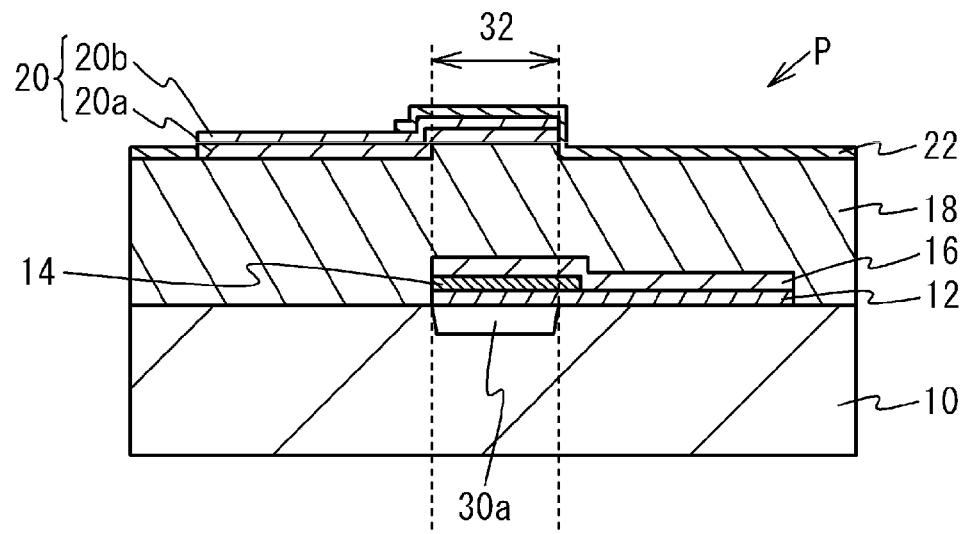
Figure 8B:
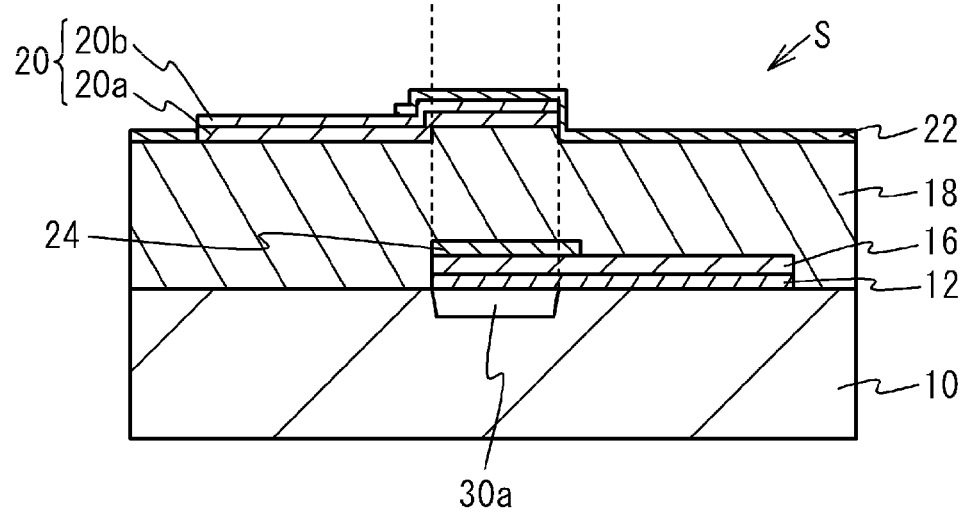

A fifth embodiment is an embodiment in which the structure of the cavity under the high acoustic impedance film 12 is different from that of the first embodiment. FIG. 8A and FIG. 8B illustrate a cross sectional view of a piezoelectric thin film resonator used for a ladder type filter in accordance with the fifth embodiment. FIG. 8A illustrates a cross sectional view of a parallel resonator of the ladder type filter. FIG. 8B illustrates a cross sectional view of a series resonator of the ladder type filter. As illustrated in FIG. 8A and FIG. 8B, a recess is formed on the upper face of the substrate 10. The high acoustic impedance film 12 has a flat shape on the upper face of the substrate 10. Thus, the recess of the substrate 10 acts as a cavity 30a. The cavity 30a is formed so as to include the resonance region 32. Other structures are the same as FIG. 1B and FIG. 1C of the first embodiment. Therefore, an explanation of the structures is omitted. The cavity 30a may penetrate the substrate 10.

In the fifth embodiment, the cavity 30a is formed instead of the cavity 30 of the first embodiment. However, the cavity 30a may be formed instead of the cavities 30 of the second to fourth embodiments.

[Sixth Embodiment]

Figure 9A:
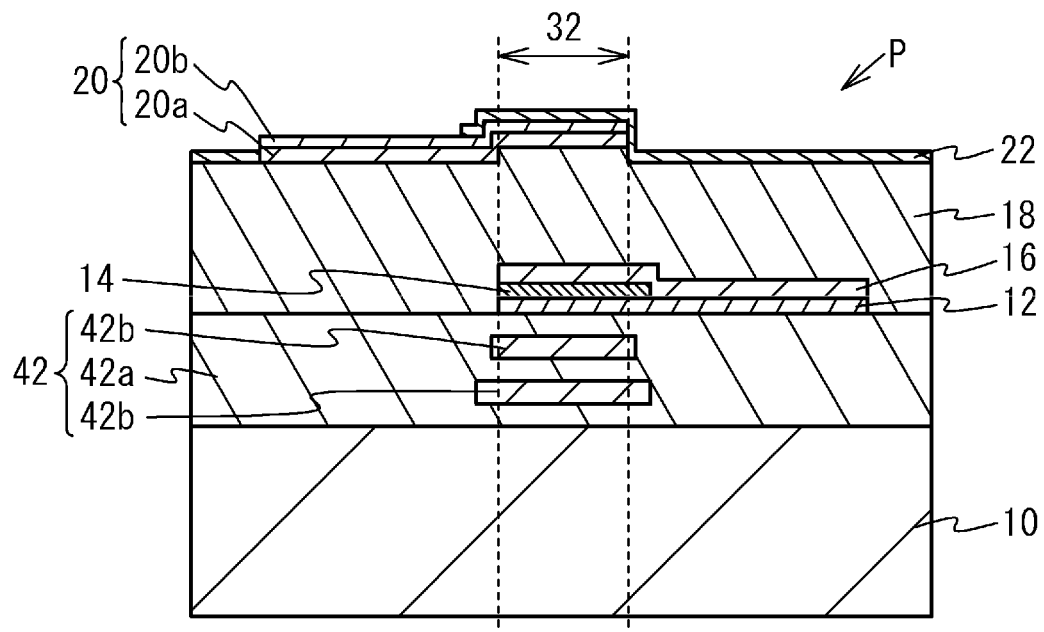
FIG. 9A and FIG. 9B illustrate a cross sectional view of a piezoelectric thin film resonator used for a ladder type filter in accordance with a sixth embodiment.
Figure 9B:
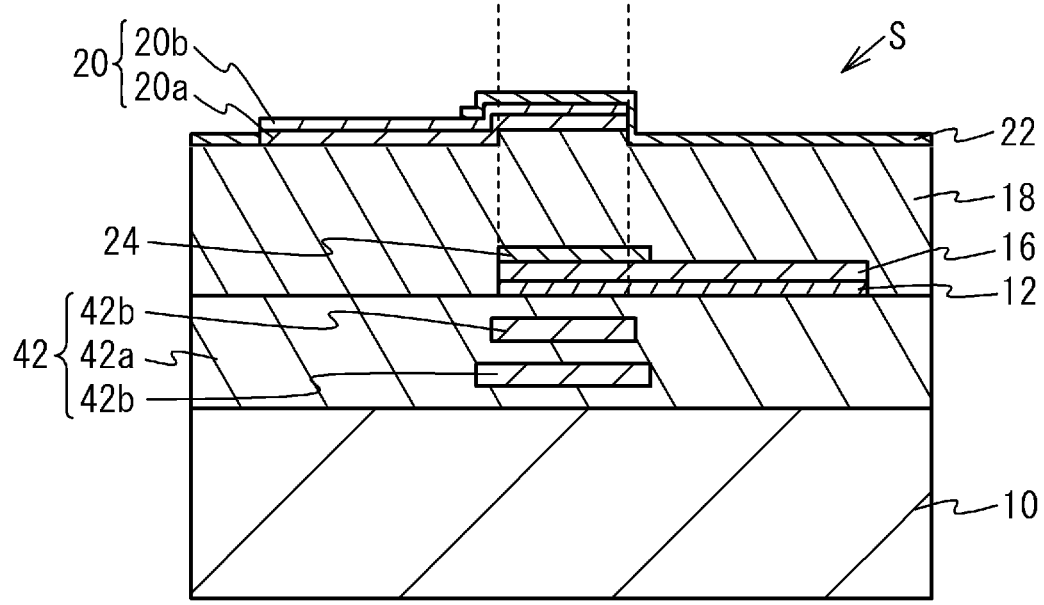

A sixth embodiment is an embodiment in which a sound reflecting film is provided instead of a cavity. FIG. 9A and FIG. 9B illustrate a cross sectional view of a piezoelectric thin film resonator used for a ladder type filter in accordance with the sixth embodiment. FIG. 9A illustrates a cross sectional view of a parallel resonator of the ladder type filter. FIG. 9B illustrates a cross sectional view of a series resonator of the ladder type filter. As illustrated in FIG. 9A and FIG. 9B, a sound reflecting film 42 is provided under the high acoustic impedance film 12 of the resonance region 32. The sound reflecting film 42 is a film that reflects an acoustic wave propagating in the piezoelectric film 18, and has a structure in which a film 42a having low acoustic impedance and a film 42b having high acoustic impedance are alternately provided. The thickness of the film 42a and the film 42b is, for example, $\lambda/4$ ($\lambda$ is a wavelength of an acoustic wave). The structure of the sound reflecting film 42 may be arbitrarily changed in order to achieve desirable characteristic. The lamination number of the film 42a and the film 42b can be arbitrarily set. Other structures are the same as FIG. 1B and FIG. 1C of the first embodiment. Therefore, an explanation of the structures is omitted.

In the sixth embodiment, the sound reflecting film 42 is provided instead of the cavity 30 of the first embodiment. However, the sound reflecting film 42 may be provided instead of the cavities 30 of the second embodiment to the fifth embodiment.

In this manner, the piezoelectric thin film resonator may be an FBAR (Film Bulk Acoustic Resonator) in which the cavity 30 or the cavity 30a is provided under the lower electrode 16 in the resonance region 32, as in the cases of the first to fifth embodiments. As in the case of the sixth embodiment, the piezoelectric thin film resonator may be an SMR (Solidly Mounted Resonator) in which the sound reflecting film 42 is provided under the lower electrode 16 in the resonance region 32.

In the first to sixth embodiments, a description is given of the cases where the resonance region 32 has the ellipse shape. However, the resonance region 32 may have another shape such as a polygonal shape such as a tetragon shape or a pentagon shape. In the first to sixth embodiments, a description is given of the cases where the ladder type filter is used as an acoustic filter. However, another filter including a series resonator and a parallel resonator of a piezoelectric thin film resonator such as a lattice type filter may be applied to the first to sixth embodiments.

[Seventh Embodiment]

Figure 10:
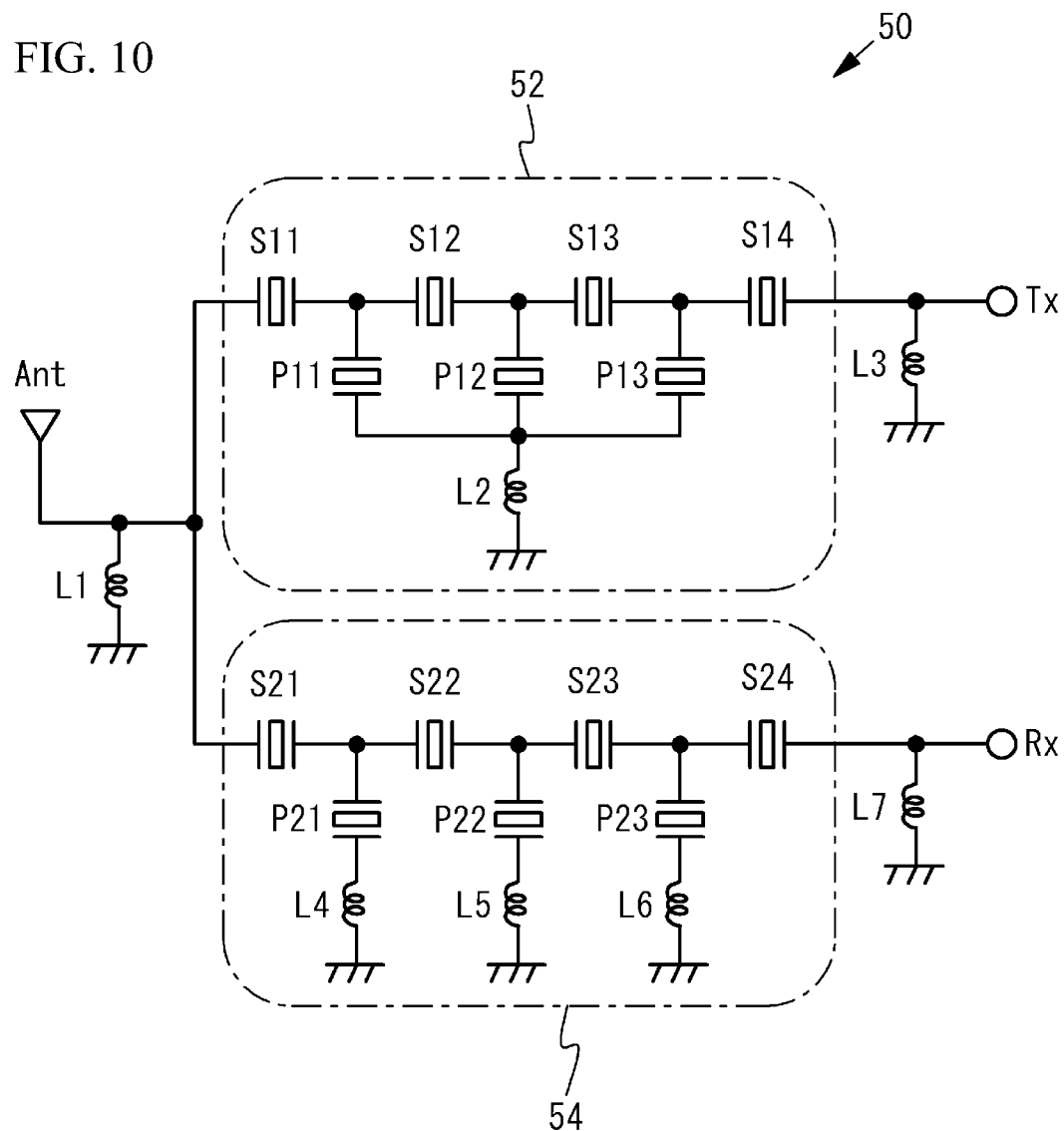
FIG. 10 illustrates a circuit diagram of a duplexer in accordance with a seventh embodiment.

A seventh embodiment is an embodiment of a duplexer. FIG. 10 illustrates a circuit diagram of a duplexer in accordance with the seventh embodiment. As illustrated in FIG. 10, a duplexer 50 in accordance with the seventh embodiment has a transmit filter 52 and a receive filter 54. The transmit filter 52 is connected between an antenna terminal Ant and a transmit terminal Tx. The receive filter 54 is connected between the antenna terminal Ant that is common with the transmit filter 52 and a receive terminal Rx. An inductor L1 is provided between the antenna terminal Ant and a ground. The transmit filter 52 transmits a signal having a transmit band of signals input from the transmit terminal Tx through the antenna terminal Ant as a transmit signal, and suppresses the signals having the other frequency. The receive filter 54 transmits a signal having a receive band of signals input from the antenna terminal Ant through the receive terminal Rx as a receive signal, and suppresses the signals having the other frequency. The inductor L1 performs an impedance matching so that the transmit signal passing through the transmit filter 52 is not leaked to the receive filter 54 and is output from the antenna terminal Ant.

The transmit filter 52 and the receive filter 54 are ladder type filters in which a plurality of piezoelectric thin film resonators are connected like a ladder as series resonators and parallel resonators. The transmit filter 52 has a structure in which a plurality of series resonators S11 to S14 are connected in series between the transmit terminal Tx (input terminal) and the antenna terminal Ant (output terminal) and a plurality of parallel resonators P11 to P13 are connected in parallel between the transmit terminal Tx and the antenna terminal Ant. Grounds of the parallel resonators P11 to P13 are commonalized. An inductor L2 is connected between the parallel resonators P11 to P13 and the common ground. An inductor L3 for matching is connected between the transmit terminal Tx and the ground. The receive filter 54 has a structure in which a plurality of series resonators S21 to S24 are connected in series between the antenna terminal Ant (input terminal) and the receive terminal Rx (output terminal) and a plurality of parallel resonators P21 to P23 are connected in parallel between the antenna terminal Ant and the receive terminal Rx. Inductors L4 to L6 are respectively connected between the plurality of parallel resonators P21 to P23 and the ground. An inductor L7 for matching is connected between the receive terminal Rx and the ground.

In the seventh embodiment, a description will be given of a case where the receive band is higher than the transmit band. In this case, the ladder type filter of the first embodiment is used as the receive filter 54. This is because improvement of the temperature coefficient of frequency on the low frequency side (guard band side) of the receive band is required with respect to the receive filter 54. Thus, the electromechanical coupling coefficient can be enlarged and the temperature coefficient of frequency on the low frequency side of the receive band can be improved. With respect to the transmit filter 52, the improvement of the temperature coefficient of frequency on the high frequency side (guard band side) of the transmit band is required. It is therefore preferable that a ladder type filter, in which a series resonator has a temperature compensation film and a parallel resonator does not have a temperature compensation film, is used.

In the seventh embodiment, the receive band is higher than the transmit band. However, according to the spec, the transmit band may be higher than the receive band. In this case, the ladder type filter of the first embodiment may be used as the transmit filter 52. In this manner, the ladder type filter of the first embodiment may be used as at least one of the transmit filter and the receive filter structuring a duplexer.

In the seventh embodiment, the ladder type filter of the first embodiment is used for at least one of the transmit filter and the receive filter. However, the ladder type filters of the second to sixth embodiments may be used.

The present invention is not limited to the specifically described embodiments, but other embodiments and variations may be made without departing from the scope of the claimed invention.

What is claimed is:

1. An acoustic wave filter comprising
    series resonators and parallel resonators that have a piezoelectric film on an identical substrate and have a lower electrode and an upper electrode that sandwich the piezoelectric film and face with each other,
    wherein:
    one of the series resonators and the parallel resonators has a temperature compensation film on a face of the lower electrode or the upper electrode that is opposite to the piezoelectric film and does not have an added film in a resonance region in which the lower electrode and the upper electrode sandwich the piezoelectric film and face with each other, the compensation film having an elastic constant of a temperature coefficient of which sign is opposite to a sign of a temperature coefficient of an elastic constant of the piezoelectric film; and
    another of the series resonators and the parallel resonators has the added film in the resonance region on the same side as the temperature compensation film of said one of the series resonators and the parallel resonators on the lower electrode side or the upper electrode side compared to the piezoelectric film, and does not have a temperature compensation film on a face corresponding to the face in said one of the series resonators and the parallel resonators on which the temperature compensation film is provided in said one of the series resonators and the parallel resonators.

2. The acoustic wave filter as claimed in claim 1, wherein:
    the added film is made of a piezoelectric material provided between the lower electrode or the upper electrode and the piezoelectric film; and
    a total thickness of the piezoelectric film and the added film in the resonance region of said another of the series resonators and the parallel resonators is larger than that of the piezoelectric film in the resonance region of the one of the series resonators and the parallel resonators.

3. The acoustic wave filter as claimed in claim 1, wherein:
    the temperature compensation film is provided on a face of the lower electrode that is opposite to the piezoelectric film;
    the added film is provided on the lower electrode side compared to the piezoelectric film; and
    the piezoelectric film extends to on the substrate from on the lower electrode so as to cover an edge face of the lower electrode.

4. The acoustic wave filter as claimed in claim 1 further comprising a high acoustic impedance film having higher acoustic impedance than the temperature compensation film on a face of the temperature compensation film that is opposite to the piezoelectric film.

5. The acoustic wave filter as claimed in claim 1, wherein the temperature compensation film in said one of the series resonators and the parallel resonators does not overlap, in a plan view, at least a part of an extraction portion of the lower electrode or the upper electrode extending from the resonance region.

6. The acoustic wave filter as claimed in claim 1, wherein the temperature compensation film has silicon oxide or silicon nitride as a main component.

7. The acoustic wave filter as claimed in claim 6, wherein the temperature compensation film is made of silicon oxide in which fluorine is doped.

8. The acoustic wave filter as claimed in claim 1, wherein the piezoelectric film has aluminum nitride as a main component.

9. The acoustic wave filter as claimed in claim 1, wherein a cavity is formed between the substrate and the lower electrode in the resonance region.

10. The acoustic wave filter as claimed in claim 1 further comprising a sound reflecting film under the lower electrode in the resonance region, the sound reflecting film reflecting an acoustic wave that propagates the piezoelectric film.

11. A duplexer comprising:
    a transmit filter; and
    a receive filter, wherein at least one of the transmit filter and the receive filter has an acoustic wave filter, the acoustic wave filter comprising series resonators and parallel resonators that have a piezoelectric film on an identical substrate and have a lower electrode and an upper electrode that sandwich the piezoelectric film and face with each other, wherein:

one of the series resonators and the parallel resonators has a temperature compensation film on a face of the lower electrode or the upper electrode that is opposite to the piezoelectric film and does not have an added film in a resonance region in which the lower electrode and the upper electrode sandwich the piezoelectric film and face with each other, the compensation film having an elastic constant of a temperature coefficient of which sign is opposite to a sign of a temperature coefficient of an elastic constant of the piezoelectric film; and another of the series resonators and the parallel resonators has the added film in the resonance region on the same side as the temperature compensation film of said one of the series resonators and the parallel resonators on the lower electrode side or the upper electrode side compared to the piezoelectric film, and does not have a temperature compensation film on a face corresponding to the face in said one of the series resonators and the parallel resonators on which the temperature compensation film is provided in said one of the series resonators and the parallel resonators.

12. An acoustic wave filter comprising:

series resonators and parallel resonators that have a piezoelectric film on an identical substrate and have a lower electrode and an upper electrode that sandwich the piezoelectric film and face with each other, wherein:

one of the series resonators and the parallel resonators has a temperature compensation film on a face of the lower electrode or the upper electrode that is opposite to the piezoelectric film in a resonance region in which the lower electrode and the upper electrode sandwich the piezoelectric film and face with each other, the compensation film having an elastic constant of a temperature coefficient of which sign is opposite to a sign of a temperature coefficient of an elastic constant of the piezoelectric film;

another of the series resonators and the parallel resonators has an added film in the resonance region on the same side as the temperature compensation film of the one of the series resonators and the parallel resonators on the lower electrode side or the upper electrode side compared to the piezoelectric film;

the added film is made of a piezoelectric material provided between the lower electrode or the upper electrode and the piezoelectric film; and a total thickness of the piezoelectric film and the added film in the resonance region of said another of the series resonators and the parallel resonators is larger than that of the piezoelectric film in the resonance region of said one of the series resonators and the parallel resonators.

\* \* \* \* \*